(12) United States Patent
Corum et al.

(10) Patent No.: US 8,519,707 B2
(45) Date of Patent: Aug. 27, 2013

(54) PULSE GAP CYCLING FOR IMPROVED SWIFT

(75) Inventors: Curtis A Corum, Shoreview, MN (US); Djaudat S. Idiyatullin, New Brighton, MN (US); Steen Moeller, Golden Valley, MN (US); Michael G. Garwood, Medina, MN (US)

(73) Assignee: Regents of the University of Minnesota, St. Paul, MN (US)

( * ) Notice: Subject to any disclaimer, the term of this patent is extended or adjusted under 35 U.S.C. 154(b) by 596 days.

(21) Appl. No.: 12/752,668

(22) Filed: Apr. 1, 2010

(65) Prior Publication Data

US 2010/0253341 A1 Oct. 7, 2010

Related U.S. Application Data

(60) Provisional application No. 61/166,073, filed on Apr. 2, 2009.

(51) Int. Cl.
*G01V 3/00* (2006.01)

(52) U.S. Cl.
USPC ............................................................ 324/307

(58) Field of Classification Search
USPC ................................................. 324/300–322
See application file for complete search history.

(56) References Cited

U.S. PATENT DOCUMENTS

| | | | |
|---|---|---|---|
| 4,438,400 A | 3/1984 | Patt | |
| 5,140,268 A | 8/1992 | Chan | |
| 7,403,006 B2 * | 7/2008 | Garwood et al. | 324/310 |
| 7,425,828 B2 * | 9/2008 | Garwood et al. | 324/310 |
| 7,777,484 B2 * | 8/2010 | Garwood et al. | 324/307 |
| 7,834,625 B2 * | 11/2010 | Doyle et al. | 324/309 |
| 8,067,936 B2 * | 11/2011 | Garwood et al. | 324/307 |
| 2011/0092797 A1 * | 4/2011 | Wang et al. | 600/410 |
| 2011/0137148 A1 * | 6/2011 | Khizhnichenko | 600/411 |

OTHER PUBLICATIONS

"International Application Serial No. PCT/US2011/030744, International Search Report mailed May 23, 2011", 3 pgs.
"International Application Serial No. PCT/US2011/030744, Written Opinion mailed May 23 2011", 6 Pgs.
Baker, E. B., et al., "Time-Sharing Modulation at 200 kc Aplied to Broad and Narrow Line NMR for Base-Line Stability", *The Review of Scientific Instruments*, vol. 36, No. 10, (Oct. 1985), 1495-1498.
Idiyatullin, D., et al., "Fast and quiet MRI using a swept radiofrequency", *Journal of Magnetic Resonance*, 181(2), (Aug. 2006), 342-349.
"International Application Serial No. PCT/US2011/030744, Preliminary Report on Patentability mailed Oct. 11, 2012", 7 pgs.

* cited by examiner

*Primary Examiner* — Dixomara Vargas
(74) *Attorney, Agent, or Firm* — Schwegman, Lundberg & Woessner, P.A.

(57) ABSTRACT

A magnetic resonance image is produced by shifting a gap during acquisition of spin data for a specimen. The spin data is generated by a gapped excitation sequence.

16 Claims, 12 Drawing Sheets

PULSE GAP CYCLING FOR IMPROVED SWIFT

CLAIM OF PRIORITY

This patent application claims the benefit of priority, under 35 U.S.C. Section 119(e), to Curtis A. Corum et al., U.S. Provisional Patent Application Ser. 61/166,073, entitled "PULSE GAP CYCLING FOR IMPROVED SWIFT," filed on Apr. 2, 2009. U.S. Provisional Patent Application Ser. 61/166,073 is incorporated herein by reference.

STATEMENT REGARDING FEDERALLY SPONSORED RESEARCH OR DEVELOPMENT

This invention was made with government support under award number BTRR P 41 RR008079 from the National Institutes of Health (NIH). The government has certain rights in this invention.

BACKGROUND

Under certain circumstances, images generated using magnetic resonance can exhibit undesirable artifacts. One example of an artifact appears as a bullseye having concentric rings of alternating dark and light regions in the image. Present systems are inadequate for mitigating the effects of such artifacts.

OVERVIEW

The present subject matter includes methods and systems for generating an image using Sweep Imaging with Fourier Transform (SWIFT), SWIFT with Limited TE (SWIFT-LiTE) or ultrashort TE (UTE). The gating of the transmitter and the receiver can produce artifacts in the image. By shifting the gap among a number of discrete positions, the effects of the artifact can be reduced. Further mechanisms for reducing the artifact are also described.

The effects of gated transmit signal and gated receiver in combination with oversampled digitization and digital filtering are demonstrated. Transmitter and receiver duty cycles can be configured to reduce image artifacts.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Part 1 includes a description of an example of a magnetic resonance system. Part 2 describes an example of the SWIFT imaging protocol. Part 3 describes an example of pulse gap cycling. Part 4 includes a method description according to one example.

Part 1

Figure 1:
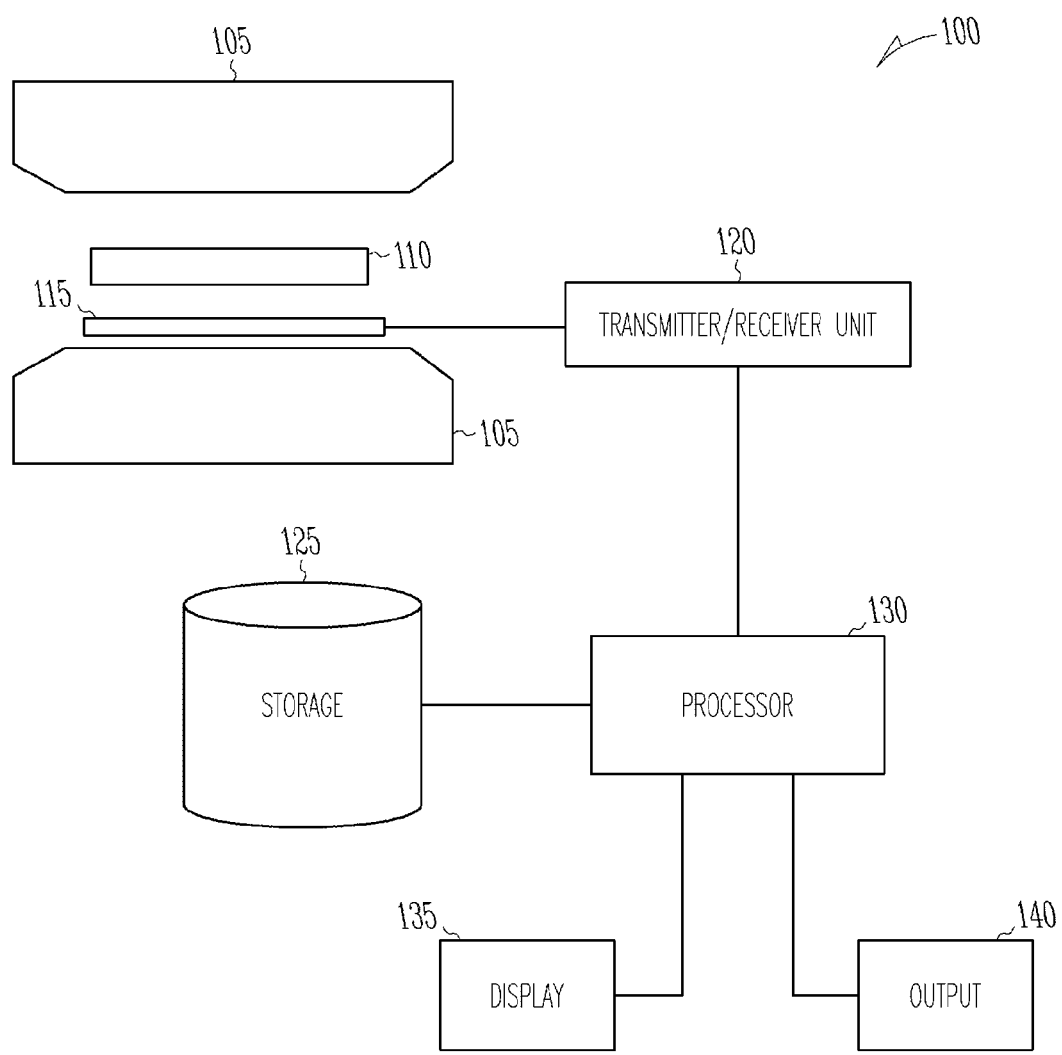
FIG. 1 includes a magnetic resonance system according to one example.

FIG. 1 includes a block diagram of magnetic resonance system 100. Magnetic resonance system 100, in one example, depicts an imaging system 100 having magnet 105. In one example, system 100 includes an electron paramagnetic resonance system. Magnet 105 can provide a biasing magnetic field. Coil 115 and subject 110 are positioned within the field of magnet 105. Subject 110 can include a human body, an animal, a phantom, or other specimen. Coil 115, sometimes referred to as an antenna, can include a transmit coil, a receive coil, a separate transmit coil and receive coil, or a transceiver coil. Coil 115 is in communication with transmitter/receiver unit 120 and with processor 130. In various examples, coil 115 both transmits and receives radio frequency (RF) signals relative to subject 110. Transmitter/receiver unit 120 can include a transmit/receive switch, an analog-to-digital converter (ADC), a digital-to-analog converter (DAC), an amplifier, a filter, or other modules configured to excite coil 115 and to receive a signal from coil 115. Transmitter/receiver unit 120 is coupled to processor 330.

Processor 130 can include a digital signal processor, a microprocessor, a controller, or other module. Processor 130, in one example, is configured to generate an excitation signal (for example, a pulse sequence) for coil 115. Processor 130, in one example, is configured to perform a post-processing operation on the signal received from coil 115. Processor 130 is also coupled to storage 125, display 135 and output unit 140.

Storage 125 can include a memory for storing data. The data can include image data as well as results of processing performed by processor 130. In one example, storage 125 provides storage for executable instructions for use by processor 130. The instructions can be configured to generate and deliver a particular pulse sequence or to implement a particular algorithm.

Display 135 can include a screen, a monitor, or other device to render a visible image corresponding to subject 110. For example, display 135 can be configured to display a radial projection, a Cartesian coordinate projection, or other view corresponding to subject 110. Output unit 140 can include a printer, a storage device, a network interface or other device configured to receive processed data.

The present subject matter can be implemented using system 100 or other system suitable for nuclear magnetic resonance, magnetic resonance imaging, electron spin resonance (ESR), electron paramagnetic resonance (EPR), ferromagnetic resonance (FMR), or ferromagnetic spin wave resonance (FSWR).

Part 2

In nuclear magnetic resonance (NMR, also abbreviated as magnetic resonance, MR), RF excitation can be described as sequential, simultaneous, and random. Three different corresponding NMR techniques are used, including continuous wave (CW), pulsed, and stochastic.

Pulsed FT spectroscopy can be used with high resolution NMR. MRI has additional technical requirements over high resolution NMR. Because the objects of interest are much larger than a test tube, inevitably the static and RF fields used in MRI are more inhomogeneous than those used in high resolution NMR.

As in CW, the SWIFT method uses RF sweep excitation and uses a sweep rate that exceeds the sweep rate of the CW method by more than a few orders of magnitude. Unlike the CW method in which the signal is acquired in the frequency domain, in SWIFT, the signal is considered as a time function, as in the pulsed FT method. In addition, SWIFT uses the correlation method similar to stochastic NMR in order to extract proper spectral information from the spin system response.

The rapid-scan FT technique and SWIFT technique have some common properties but are different in point of view to system response on excitation. Rapid-scan FT considers the system response in frequency domain and SWIFT considers the system response in the time domain. As a result, the spectra obtained using SWIFT is insensitive to the linearity of the sweep rate. This permits use of a broad class of frequency modulated pulses having more uniform excitation profiles than the chirp excitation required in rapid-scan FT. SWIFT also provides virtually simultaneous excitation and acquisition of signal. Accordingly, SWIFT has a "zero echo time", and so is well-suited for studying objects having very fast spin-spin relaxation (or very short T2). SWIFT can be used for MRI of quadrupolar nuclei, such as sodium-23, potassium-39, and boron-11.

SWIFT Methodology

Figure 2A:
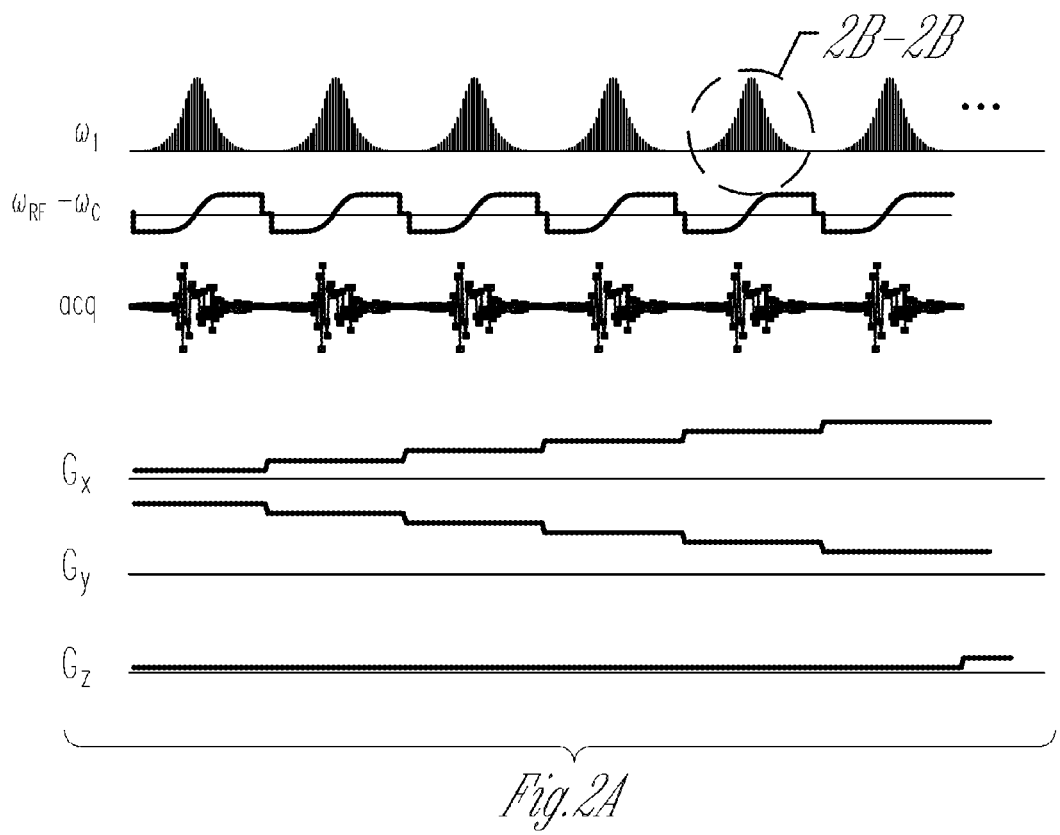
FIGS. 2A, 2B, and 2C include diagrams for a pulse sequence for SWIFT according to one example.
Figure 2B:
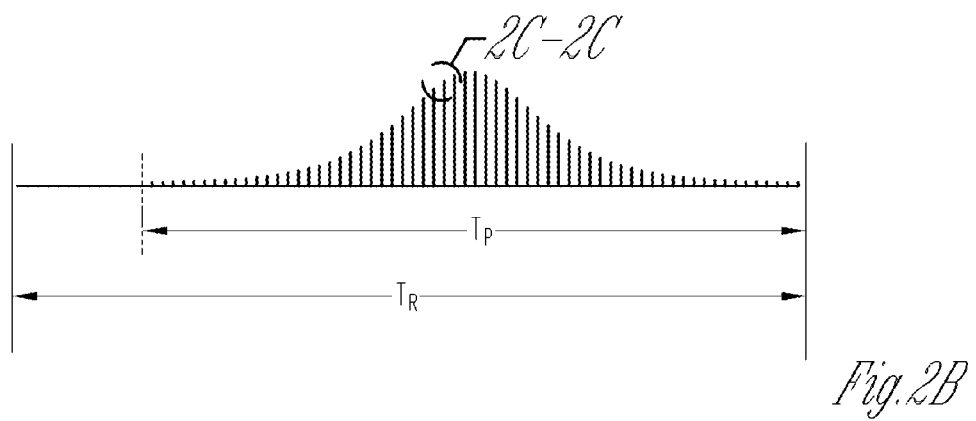

SWIFT can be modeled by the method presented in FIG. 2A. SWIFT employs a sequence of frequency-modulated pulses with short repetition time TR that exceeds the pulse length $T_P$ by at least the amount of time needed for setting a new value (or orientation) of a magnetic field gradient used to encode spatial information. The images are processed using 3D back-projection reconstruction. In one example, frequency-modulated pulses from the hyperbolic secant family (HSn pulses) are used. In FIG. 2B, one shaped pulse is represented which includes N different sub-pulse elements with time-dependent amplitudes and phases. During the FM pulse, an isochromat follows the effective RF field vector until the instant resonance is attained. At resonance, the isochromat is released from the RF pulse's "hug" and thereafter almost freely processes with a small decaying modulation, yielding spectral contamination. Thus, to extract spectral information from such a spin system response, processing is performed using a cross-correlation method similar to the method of recovering phase information in stochastic NMR. The theoretically achievable signal-to-noise ratio (SNR) per unit time for SWIFT for $TR \ll T_1$ is the same as that for pulsed FT. During SWIFT acquisition, the applied imaging gradients usually exceed all intrinsic gradients due to susceptibility or inhomogeneity. For this condition the images obtained are fully independent of transverse relaxation and signal intensity depends only on $T_1$ and spin density. The maximum $T_1$ contrast depends on effective flip angle and the best compromise between sensitivity and contrast will have flip angles exceeding two times the Ernst angle. If flip angles are very small, $T_1$ contrast is negligible, and contrast comes entirely from spin density. Other kinds of contrast can be reached by an appropriate preparation sequence prior to or interleaved with the image acquisition.

SWIFT provides novel and beneficial properties for MRI, including the following:

(a) fast: SWIFT eliminates the delays associated with refocusing pulses or gradient inversion, and also time for an excitation pulse, which is integrated with the acquisition period. As in other fast imaging sequences, SWIFT is limited by existing imaging system hardware and chosen compromise between acquisition speed, spatial resolution and SNR.

(b) sensitive to short $T_2$: SWIFT is sensitive to excited spins having $T_2 > 1/SW$ (SW=spectral width). To be specifically resolved, $T_2 > N/SW$ must be satisfied, which is theoretically feasible even for solid objects by increasing SW.

(c) reduced motion artifacts: Because SWIFT has no "echo time" it is less sensitive to motion artifacts. It loses less signal due to either diffusion in the presence of a gradient or uncompensated motion than other fast sequences.

(d) reduced dynamic range requirement: Because the different frequencies are excited sequentially the resulting signal is distributed in time with decreased amplitude of the acquired signal. This allows more effective utilization of the dynamic range of the digitizer.

(e) quiet: SWIFT uses a small step when changing gradients between projections, and thus, fast gradient switching that creates loud noise can be avoided. SWIFT can also be operated in rapid updated mode to reach high temporal resolution in dynamic studies. This pseudo-temporal resolution is possible because projection reconstruction, unlike Fourier imaging, samples the center of k-space with every acquisition.

In sum, SWIFT is a fast 3D radial MRI sequence that performs nearly simultaneous excitation and acquisition of spins within a gapped RF pulse. SWIFT entails a chain of gapped HSn low flip angle excitation pulses (including frequency sweep "f") in the presence of a constant (per-view) readout gradient. NMR signal is received in the gaps where the transmitter is gated off and the receiver is gated on (doubly-gated). SWIFT has desirable features for a fast radial 3D sequence, including high acquisition duty cycle, immunity to gradient integral errors, extremely short $T_2$ sensitivity, and very smooth gradient updates (quiet, low gradient hardware demand).

Part 3

The excitation signal used in SWIFT includes a series of gaps. The gaps in the transmitted signal produce corresponding gaps in the received signal. In SWIFT, the gap duration is used to insert intervals of single A-to-D conversion or multiple A-to-D conversion that is used to receive and encode the NMR or MRI signal. Multiple A-to-D conversion can be used with receiver oversampling.

The rapid gating of the transmitted excitation signal and the received signal can introduce artifacts that impair the resulting image.

Figure 2C:
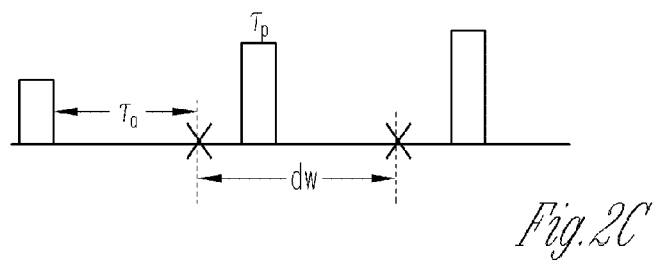

Consider an example using the SWIFT pulse sequence shown in FIGS. 2A, 2B, and 2C. The sequence, here described as a gapped HSn pulse, can be modeled as shown in FIGS. 3A, 3B, and 3C.

Figure 3A:
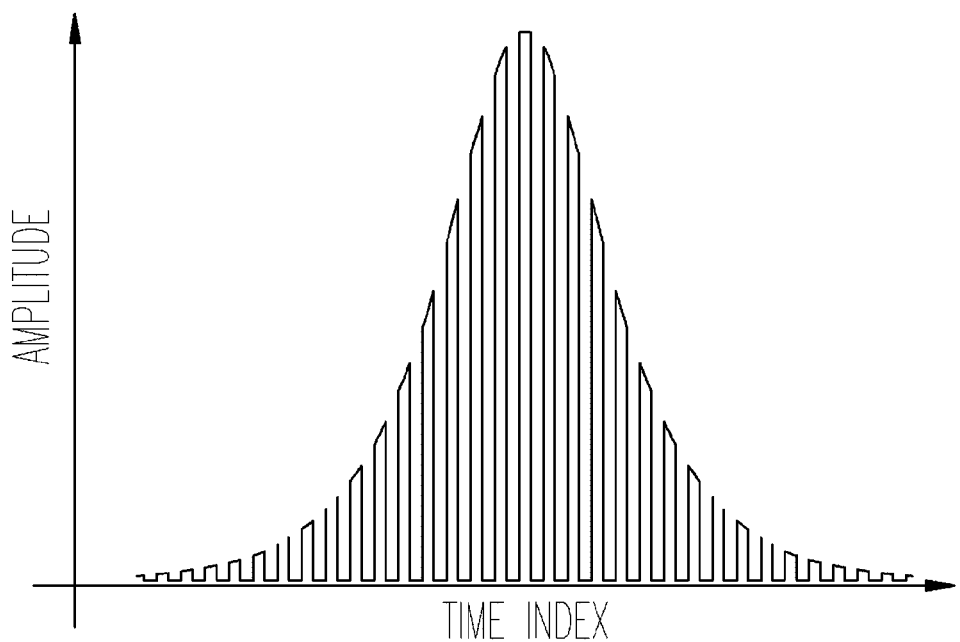
FIG. 3A illustrates an amplitude sweep for SWIFT gapped HSn pulse in the time domain.
Figure 3B:
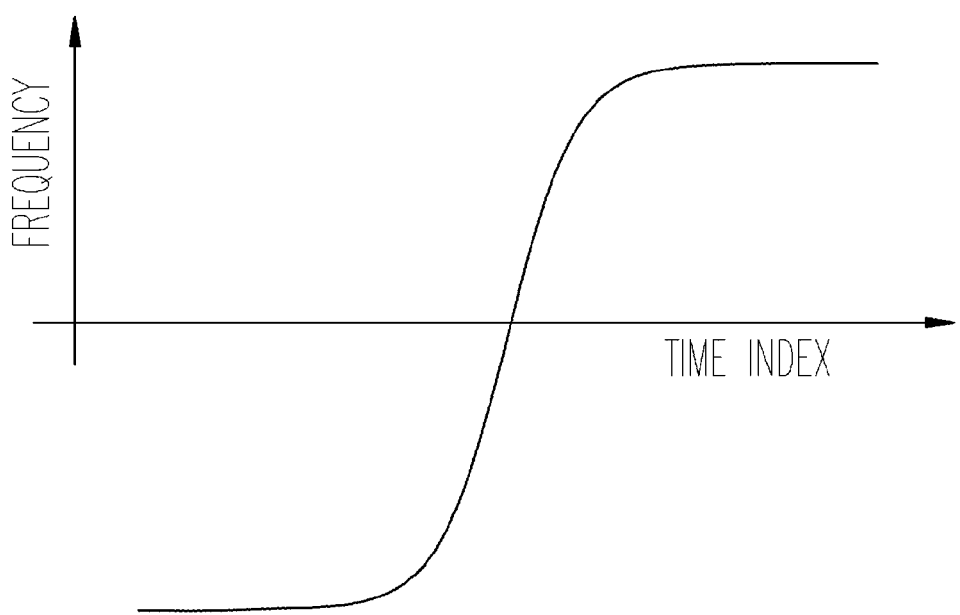
FIG. 3B illustrates a frequency sweep for SWIFT gapped HSn pulse in the time domain.

FIGS. 3A and 3B present a time domain representation showing the swept amplitude and the swept frequency in the excitation pulse.

Figure 3C:
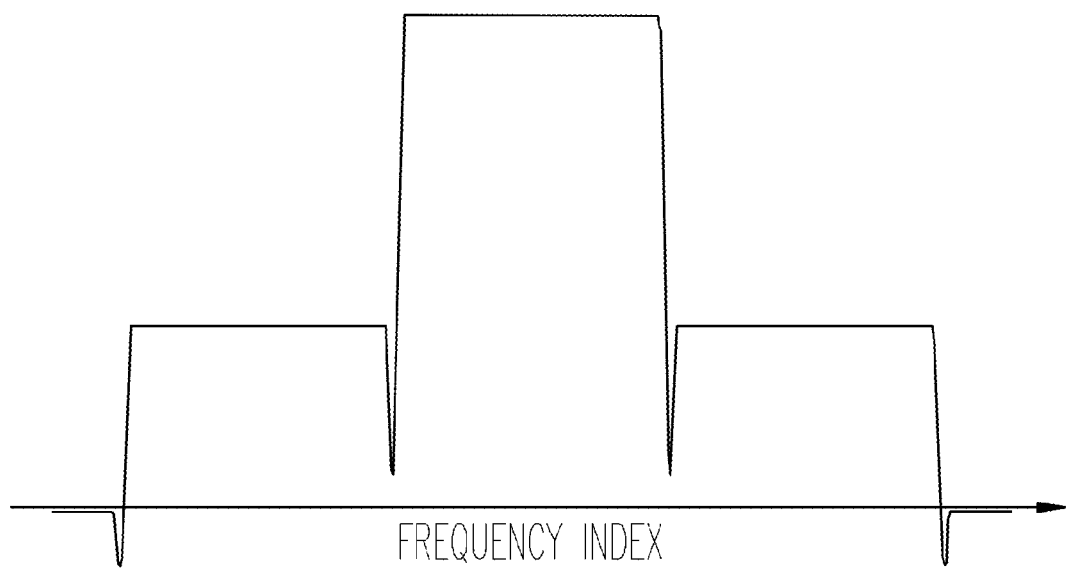
FIG. 3C illustrates a frequency domain representation for SWIFT gapped HSn pulse.

When viewed in the frequency domain, as shown in FIG. 3C, the baseband corresponds to the excitation signal and the side bands corresponds to the gaps in the excitation signal. The sidebands, or side lobes, can be represented as a +1 side band and a −1 side band. The gaps in the transmitted excitation pulse produce sidebands in the frequency domain excitation profile. The gaps in the acquisition interval introduces sidebands and overlap the base band in the received signal. The ripple on the transmit and receive gates results in intermodulation between the sidebands. The ripple on the gates can appear as a bullseye artifact.

Figure 4A:
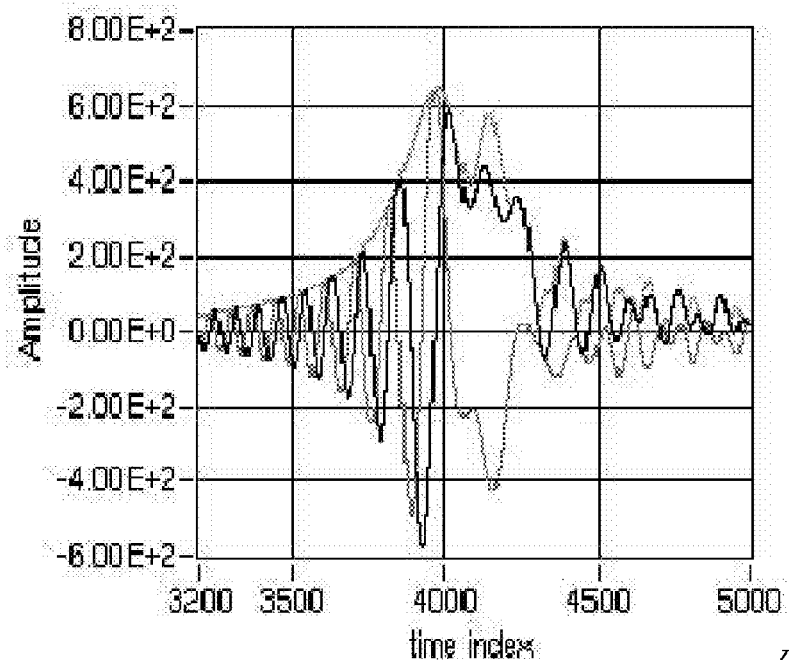
FIG. 4A illustrates a received time domain signal corresponding to excitation having no gaps.
Figure 4B:
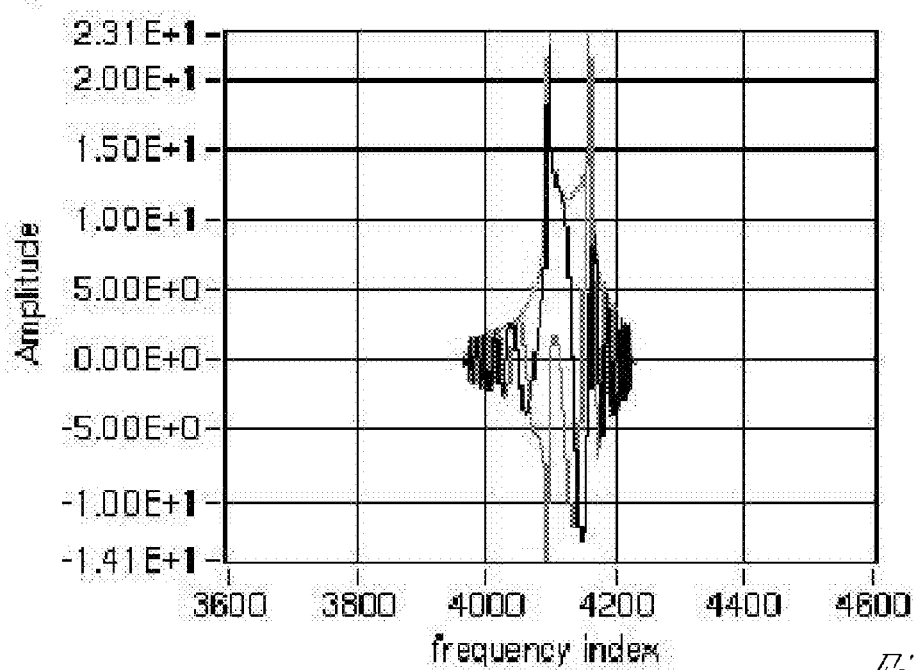
FIG. 4B illustrates a frequency domain signal corresponding to the time domain of FIG. 4A.

Consider next, a modeled system having no gaps in the transmitted excitation signal and, thus, no gaps in the received signal. FIG. 4A illustrates theoretical system performance in the time domain and shows a simulated pseudo free induction decay (FID). FIG. 4A corresponds to the acquired data in the SWIFT pulse sequence figure (FIG. 3C). The spin spectrum response (in the frequency domain) is shown in FIG. 4B and illustrates a Fourier domain signal having content both before and after the peaks. FIG. 4B shows the spin system response spectrum for an ungapped HSn profile multiplied with a rect function (including imaginary dispersion component). The signal is limited due to the HSn profile.

Figure 5A:
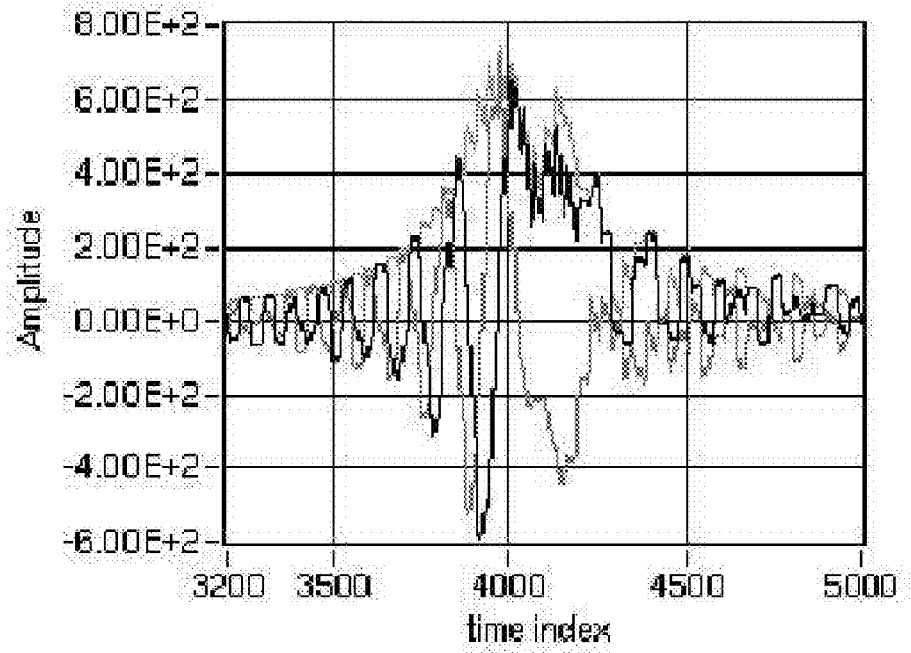
FIG. 5A illustrates a received time domain signal corresponding to excitation having gaps in the transmitted signal.
Figure 5B:
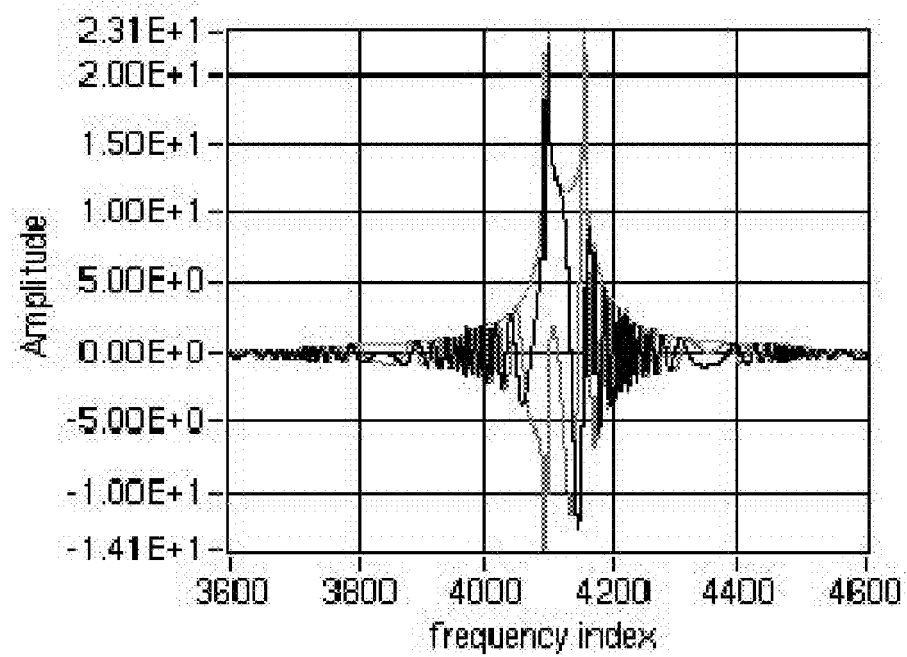
FIG. 5B illustrates a frequency domain signal corresponding to the time domain of FIG. 5A.

Consider next, a modeled system having gaps in the transmitted excitation signal. FIG. 5A illustrates such a theoretical signal in the time domain where the transmitter gate has a 25% duty cycle. The duty cycle percentage denotes the portion of time during which the device (transmitter or receiver) is powered on. The signal in FIG. 5A exhibits high frequency ripple. FIG. 5B illustrates the corresponding spin spectrum response (in the frequency domain). The ripples are caused by the spin systems interaction with the side bands of the transmitted pulse. In particular, the side bands of the gapped pulse interact with the imaginary tails of the rect dispersion component, thus increasing the effective signal bandwidth. In this case, the interaction is only with the dispersion (Im) component of the spin system response.

Figure 6A:
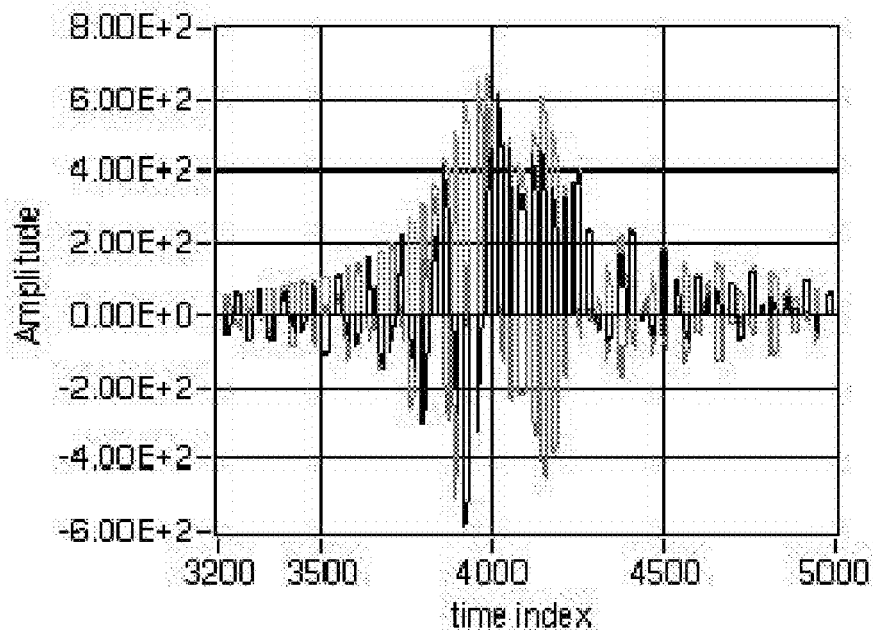
FIG. 6A illustrates a received time domain signal corresponding to excitation having gaps in the transmitted signal and gaps in the received signal.
Figure 6B:
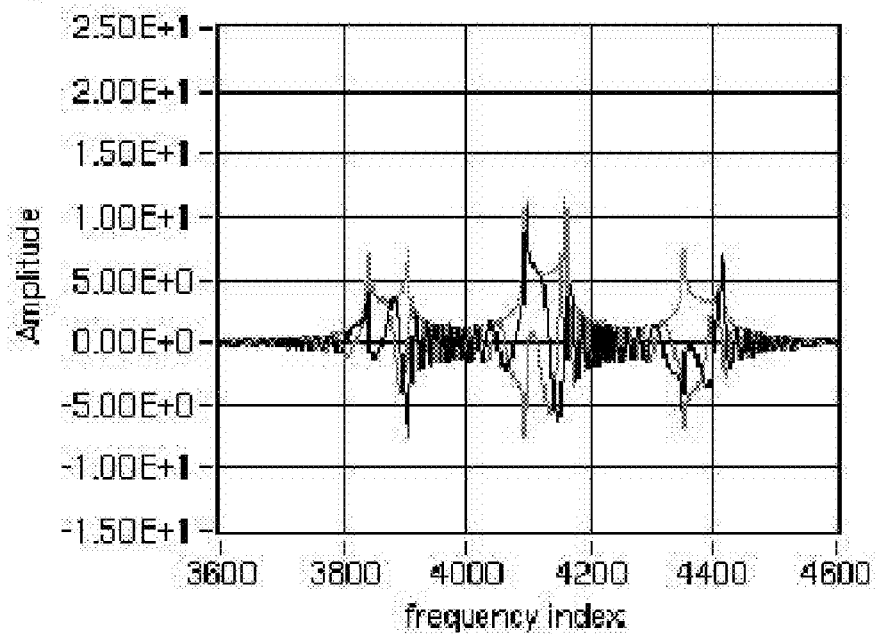
FIG. 6B illustrates a frequency domain signal corresponding to the time domain of FIG. 6A.

Consider next, a modeled system having gaps in both the transmitted excitation signal and the received spin system signal. FIG. 6A illustrates that the ripples are now visible in the received data. In this example, the transmitter duty cycle is 25% and the receiver duty cycle is 50%. When viewed in the frequency domain, as in FIG. 6B, the signal tails extend over the base band and appear in the side bands as well. FIG. 6B exhibits the folding of high frequency components from the receiver gate generating sidebands into the baseband. The spectrum illustrates the origins of the bullseye artifact which can cause a noise-like background in a SWIFT image. The artifact can be reduced by data driven correction of the folded (aliased) sidebands in the SWIFT signal processing.

In one example, the artifacts can be reduced by cycling the gap positions in the transmitter and receiver sequences. In other words, data is acquired using a series of pulses in which the gap positions are shifted. For example, with a 25% duty cycle, the data can be acquired using four discrete pulse locations. However, rather than acquiring 4× the data, each acquisition acquires a ¼ of the total data. In the case of SWIFT, a typical acquisition includes 32 interleaved spirals. Pulse gap cycling can be used to acquire 8 spirals and having pulse gap locations distributed throughout the sequence. In one example, the duty cycle is controlled by a processor and the user can select a time cycle (for example, by specifying a duty cycle) using an interface coupled to the processor.

Figure 7:
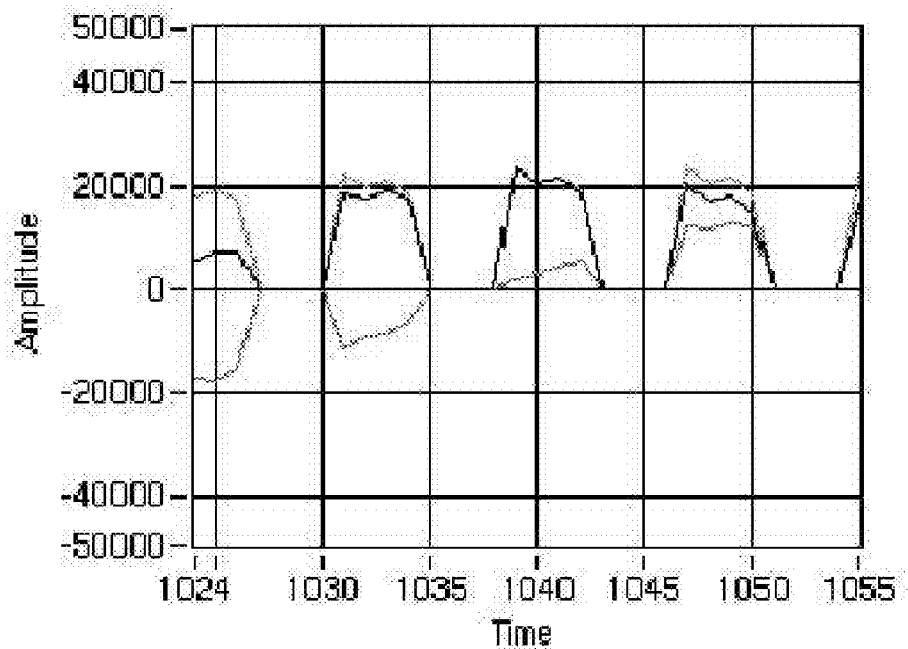
FIG. 7 illustrates gate ripple in the time domain.

FIG. 7 illustrates gate ripple in the time domain. The resulting SWIFT data for this waveform graph will include a ripple artifact. The ripple is a manifestation of receiver gating (direct effect) and folded intercorrelated signal from the sidebands (indirect effect). The waveform will produce a 75% or more bullseye artifact.

Figure 8:
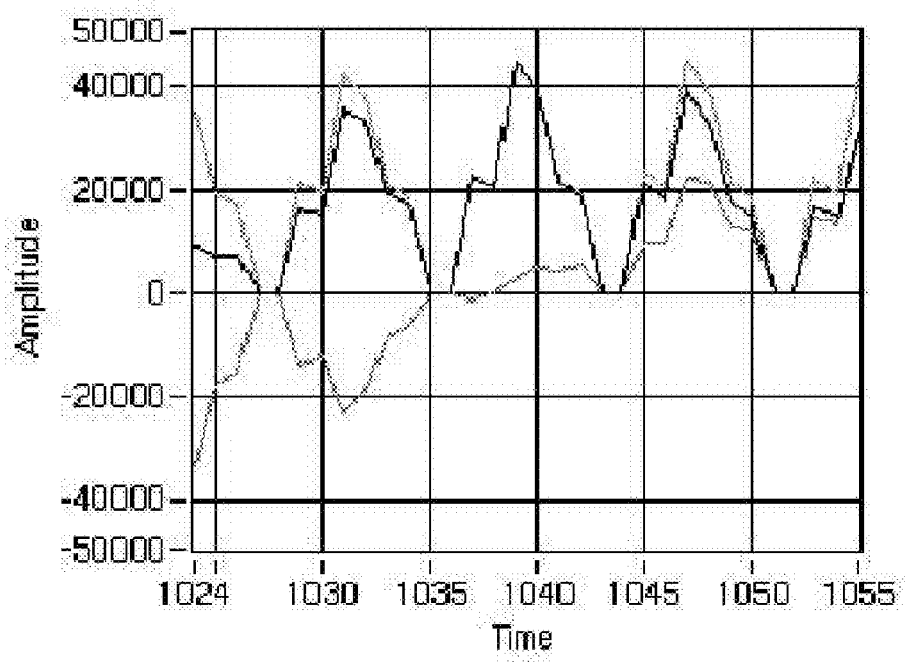
FIG. 8 illustrates a first waveform graph.
Figure 9:
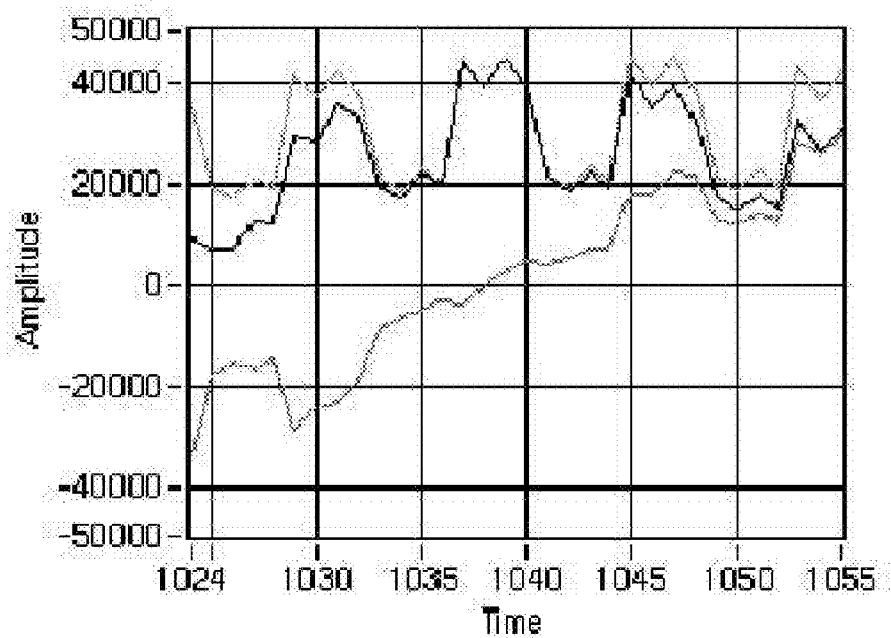
FIG. 9 illustrates a second waveform graph.
Figure 10:
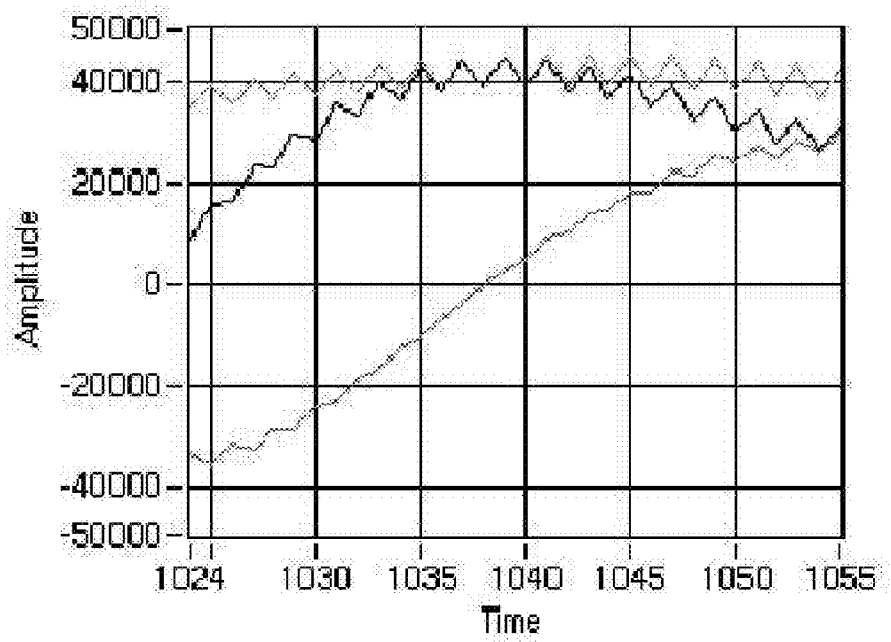
FIG. 10 illustrates a third waveform graph.

The data in FIG. 7 can be combined with other data corresponding to different pulse gap locations, and when blended together, the resulting image has reduced ripple. For example, when combined with the data shown in FIGS. 8, 9, and 10 (each representing shifted pulse gap cycling), the residual ripple is of a higher frequency. The higher frequency ripple is less likely to cause overlap in the baseband signal.

When viewed as a sinogram, the bullseye artifact appears as alternating bands of dark and light regions in the image.

Figure 11A:
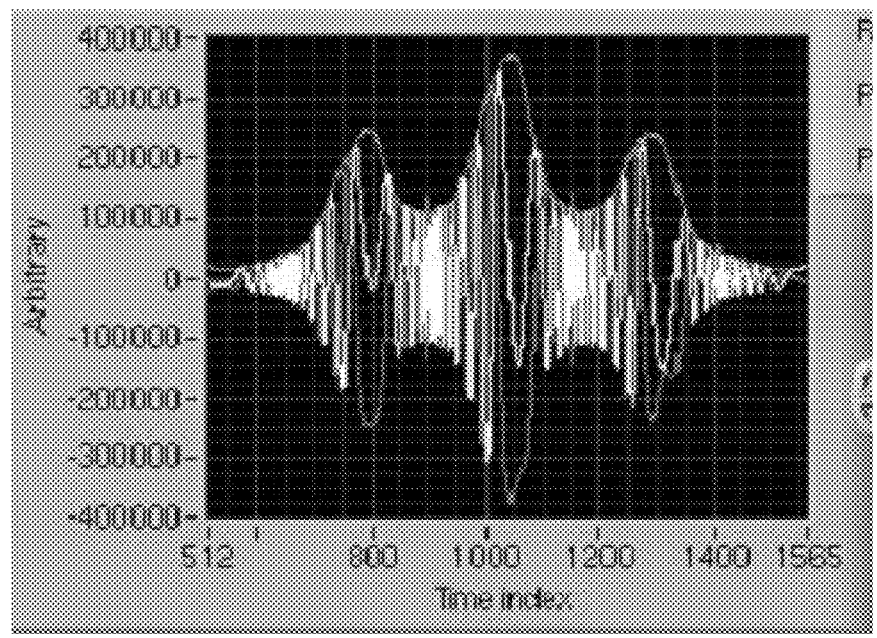
FIG. 11A illustrates a representation of an oversampled spectrum with no gap cycling.
Figure 11B:
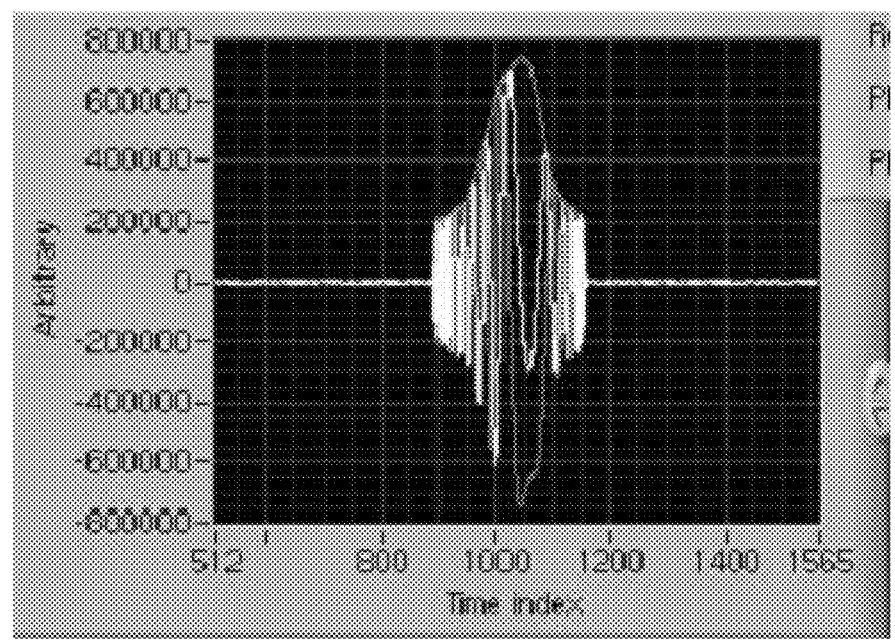
FIG. 11B illustrates a representation of an oversampled spectrum with gap cycling.

FIGS. 11A and 11B illustrate oversampled spectrum. In FIG. 11A, the spectrum is generated with no gap cycling and side lobs are clearly visible. In FIG. 11B, the sidelobes from gating (both transmitter and receiver) are cancelled. The overlap of baseband is nearly eliminated. Residual effects arising from high frequency gate ripple remain visible.

Figure 12A:
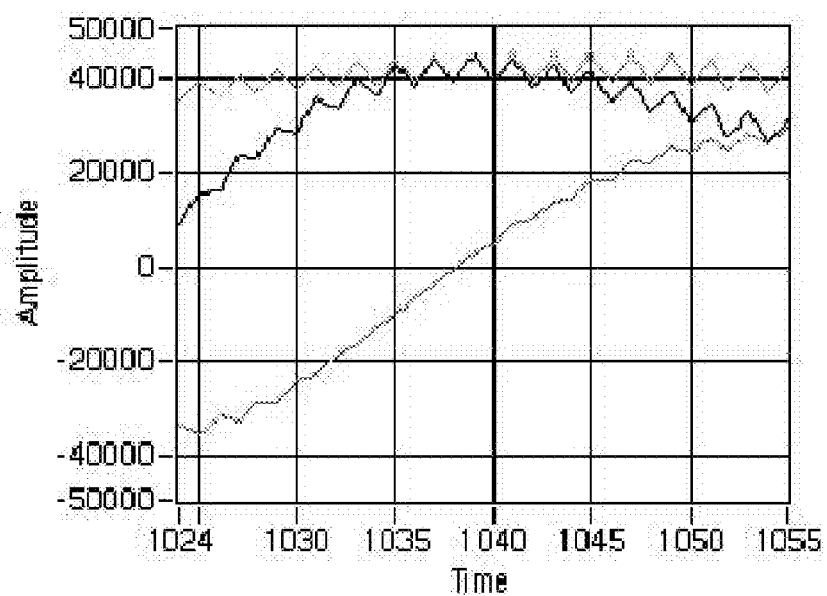
FIG. 12A illustrates an oversampled spectrum in the time domain.
Figure 12B:
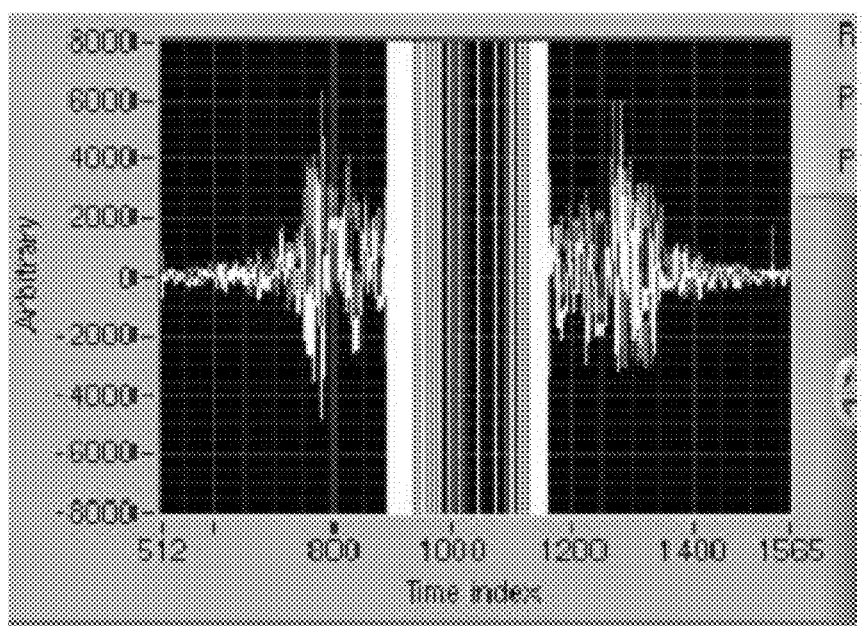
FIG. 12B illustrates an oversampled spectrum in the frequency domain.

FIGS. 12A and 12B illustrate the oversampled spectrum of FIGS. 11A and 11B at greater magnification. In FIG. 12A, the upper data exhibits some ripple arising from pulse gating and shows that the ripple is not fully smoothed by cycling and other errors. FIG. 12B exhibits some low level residual sidebands adjacent to the base band which exceeds the scale shown.

Some of the examples discussed herein described four cycles in pulse gap cycling. However, greater or less number of cycles can also be used. For example, cycling can be done at 2, 8, 12, 16, 24, 32, 64 or other values. In addition, the gate timing parameter can also be adjusted.

Part 4

Figure 13:
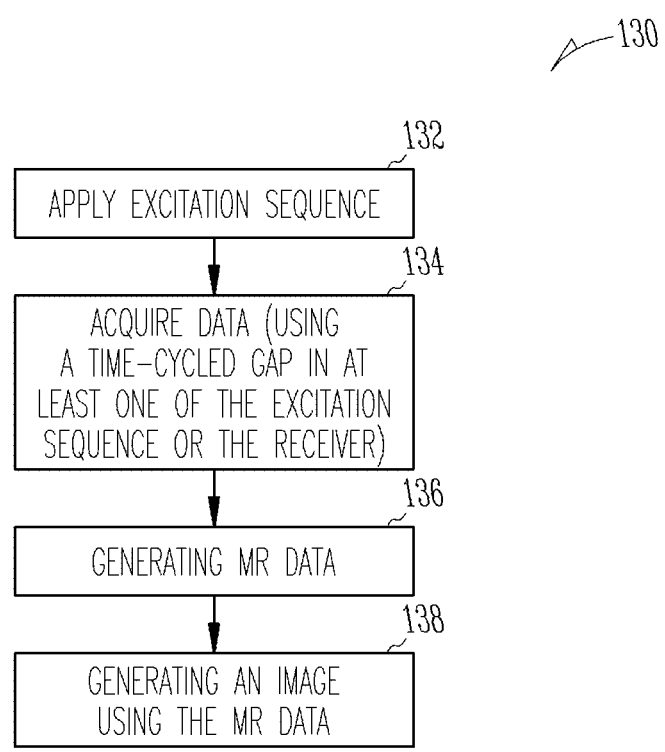
FIG. 13 illustrates a flow chart according to one example.

FIG. 13 illustrates method 130 according to one example. At 132, an excitation sequence is applied. The excitation sequence can be nearly simultaneous with the acquisition of data, and in one example, includes applying a SWIFT excitation sequence.

At 134, the data is acquired. In one example, a time cycled gap is used in the transmitter, the receiver, or in both the transmitter and receiver.

At 136, the MR data is generated. This can include combining the different gap cycles to produce a composite data set.

At 138, the MR data is further processed to produce an image for the sample. This can include applying a smoothing function or filter to the data.

Additional Notes

Pulse gap shifting can be used to reduce bullseye artifacts and to reduce the baseline outside of the object. Pulse gap shifting can produce an 'average' pulse that has no gaps and can produce phase cycling on the pulse sidebands and aliasing overlap. After shifting as described herein, some residual bullseye artifact, perhaps due to ringdown or pulse gate errors, may remain. As such, a combination of shifting (and reversal), ringdown estimation, and bullseye correction may reduce the artifact.

Reversal entails reversing the frequency sweep and is similar in concept to shifting as it shifts the gaps in the pulse to different frequencies.

The gap cycling described herein can be expressed as a periodic duty cycle. As such, the transmitter or receiver can be gated in a manner in which the duty cycling is greater or less than a value, such as 25%. For example, a 20% duty cycle can be implemented using five discrete pulses with each pulse corresponding to 20% of the total data. The gap can be cycled within a particular time at any number of discrete positions where the positions number 2, 3, 4, 5, 6, 8, 12, 16, 24 or any other number. In one example, a user can select the number of positions (or the locations of those positions) using an interface.

In addition, non-periodic gating can be used. The gating can be configured to be uniform or non-uniform in time. For example, a random function or a deterministic function can be selected for controlling the gating.

Furthermore, the received data can be resampled (up-sampled or downsampled) or oversampled. Phase attenuation and sparsity can be used as a basis for pulse gap cycling. In addition, the order of repetition can be modified. In one example, a particular line of k-space (corresponding to a view direction) of each point can be sampled. In addition, a particular view can be sampled repeatedly or a cycle can be applied to views previously considered.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A method comprising:
generating magnetic resonance (MR) data for a sample, the data corresponding to an excitation signal having a series of excitation gaps and a series of corresponding received spin system signal gaps, the excitation gaps or received spin system signal gaps having a position that is cycled among a plurality of positions throughout a duration in at least one of the excitation signal or the received spin system signal; and
generating, using a processor, an image using the MR data.

2. The method of claim 1 wherein generating MR data includes using a SWIFT MR sequence.

3. The method of claim 1 wherein generating MR data includes using a fast 3D radial MR sequence.

4. The method of claim 1 wherein generating MR data includes using a sequence that generates nearly simultaneous excitation and acquisition of spins within a gapped RF pulse.

5. The method of claim 1 wherein the gap is cycled within a predetermined period of time among discrete positions numbering at least one of 2, 3, 4, 5, 6, 8, 12, 16, and 24.

6. The method of claim 1 wherein the received spin system signal is oversampled.

7. The method of claim 1 wherein generating the image includes estimating overlap of a sideband relative to a baseband in the excitation signal.

8. The method of claim 1 wherein generating the image includes postprocessing using gridding with an oversampled Kaiser-Bessel kernel.

9. The method of claim 1 wherein generating the image includes post-processing using an average smoothness constraint.

10. The method of claim 1 wherein generating the image includes reversing a gradient.

11. The method of claim 1 wherein generating the image includes summing a plurality of data sets.

12. A non-transitory computer-readable medium having computer-executable instructions stored thereon for performing a method comprising:
   generating magnetic resonance (MR) data for a sample using an excitation sequence configured to image spins having a fast transverse relaxation rate and an acquisition sequence having a gap having a gap position that is time-cycled among a plurality of positions throughout a duration of the acquisition sequence; and
   generating an image using the MR data.

13. The non-transitory computer-readable medium of claim 12 wherein the method includes summing at least four data sets.

14. The non-transitory computer-readable medium of claim 12 wherein the acquisition sequence is oversampled.

15. A system comprising:
   a magnetic resonance scanner; and
   a processor coupled to the scanner and configured to generate magnetic resonance (MR) data for a sample, the data corresponding to an excitation signal having a series of excitation gaps and a series of corresponding received spin system signal gaps, the excitation gaps or received spin system signal gaps having a position that is cycled among a plurality of positions throughout a duration in at least one of the excitation signal or the received spin system signal;
   an output device configured to at least one of generate an image based on the MR data or store the MR data.

16. The system of claim 15 wherein the processor is configured to implement a user-selected duty cycle, the duty cycle corresponding to the gap.

\* \* \* \* \*

UNITED STATES PATENT AND TRADEMARK OFFICE
CERTIFICATE OF CORRECTION

| | | |
|---|---|---|
| PATENT NO. | : 8,519,707 B2 | Page 1 of 1 |
| APPLICATION NO. | : 12/752668 | |
| DATED | : August 27, 2013 | |
| INVENTOR(S) | : Corum et al. | |

It is certified that error appears in the above-identified patent and that said Letters Patent is hereby corrected as shown below:

On the title page, item (75), in "Inventors", line 1, delete "A" and insert --A.--, therefor On the title page, in column 2, under "Other Publications", line 4, after "23", insert --,--, therefor In the Specification In column 1, line 16-19, delete "This invention was made with government support under award number BTRR P 41 RR008079 from the National Institutes of Health (NIH). The government has certain rights in this invention." and insert --This invention was made with government support under P41-RR008079 awarded by the National Institutes of Health. The government has certain rights in the invention.--, therefor In column 3, line 51, delete "T2" and insert --$T_2$--, therefor In column 3, line 57, delete "TR" and insert --$T_R$--, therefor In column 4, line 8, delete "TR" and insert --$T_R$--, therefor In the Claims In column 9, line 11, in Claim 12, before "position", delete "having a gap", therefor Signed and Sealed this
First Day of July, 2014

Michelle K. Lee
*Deputy Director of the United States Patent and Trademark Office*